US012266561B2

(12) United States Patent
Lee et al.

(10) Patent No.: US 12,266,561 B2
(45) Date of Patent: Apr. 1, 2025

(54) APPARATUS FOR TREATING SUBSTRATE AND METHOD OF COUPLING SUPPORT UNIT

(71) Applicant: SEMES CO., LTD., Chungcheongnam-do (KR)

(72) Inventors: Sang Min Lee, Seoul (KR); Do Hyeon Yoon, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 681 days.

(21) Appl. No.: 17/529,649

(22) Filed: Nov. 18, 2021

(65) Prior Publication Data

US 2022/0165606 A1    May 26, 2022

(30) Foreign Application Priority Data

Nov. 25, 2020   (KR) .......................... 10-2020-0159562

(51) Int. Cl.
*H01L 21/687*   (2006.01)
*B08B 3/02*   (2006.01)
*B08B 3/08*   (2006.01)

(52) U.S. Cl.
CPC .... *H01L 21/6875* (2013.01); *H01L 21/68785* (2013.01); *B08B 3/02* (2013.01); *B08B 3/08* (2013.01); *H01L 21/68757* (2013.01)

(58) Field of Classification Search
CPC ........... H01L 21/6875; H01L 21/68785; H01L 21/68757; B01B 3/02; B01B 3/08
(Continued)

(56) References Cited

U.S. PATENT DOCUMENTS 5,664,337 A * 9/1997 Davis ................ H01L 21/67778
 34/328
5,882,168 A * 3/1999 Thompson ........ H01L 21/67313
 414/941
(Continued)

FOREIGN PATENT DOCUMENTS

CN 114551290 A * 5/2022 ......... H01L 21/6875
JP 2014-175669 A 9/2014
(Continued)

OTHER PUBLICATIONS

Notice of Reasons for Refusal issued by the Japanese Patent Office on Jan. 17, 2023 in corresponding JP Patent Application No. 2021-187625 with English Translation.
(Continued)

*Primary Examiner* — Stephen M Gravini
(74) *Attorney, Agent, or Firm* — Carter, DeLuca & Farrell LLP

(57) ABSTRACT

The present invention provides an apparatus for treating a substrate, including: a process chamber including a first body and a second body which are combined with each other to form a treatment space for treating a substrate is treated therein; a driver which moves the process chamber to an open position or a close position; a support unit which supports a substrate within the treatment space; and a fluid supply unit which supplies a fluid to the treatment space, in which the support unit includes: a support pin coupled to the first body or the second body; and a guide member which is coupled to the support pin and extends in a lateral direction of the support pin to support the substrate.

14 Claims, 7 Drawing Sheets

(58) Field of Classification Search
USPC ............................................................ 34/95
See application file for complete search history.

(56) References Cited

U.S. PATENT DOCUMENTS

| | | | |
|---|---|---|---|
| 6,920,704 B1* | 7/2005 | Silverbrook | B41J 15/042 |
| | | | 34/454 |
| 7,230,702 B2* | 6/2007 | Rice | H01L 21/67769 |
| | | | 414/217 |
| 7,278,813 B2* | 10/2007 | Davis | H01L 21/67781 |
| | | | 414/416.03 |
| 9,275,847 B2* | 3/2016 | Jung | H01L 21/67051 |
| 9,506,695 B2* | 11/2016 | Kim | F26B 21/003 |
| 9,624,046 B2* | 4/2017 | Mitsuyoshi | B65G 25/04 |
| 10,109,506 B2* | 10/2018 | Kim | H01L 21/02101 |
| 10,297,472 B2* | 5/2019 | Wang | H01L 21/67057 |
| 2014/0360041 A1* | 12/2014 | Jeong | F26B 25/06 |
| | | | 34/218 |
| 2018/0323064 A1 | 11/2018 | Jung et al. | |
| 2022/0165606 A1* | 5/2022 | Lee | H01L 21/67051 |

FOREIGN PATENT DOCUMENTS

| | | | | |
|---|---|---|---|---|
| JP | 2015-070014 A | | 4/2015 | |
| JP | 2020-027817 A | | 2/2020 | |
| JP | 2022083996 A | * | 6/2022 | ......... H01L 21/6875 |
| KR | 10-2001-0028021 A | | 4/2001 | |
| KR | 10-2006-0110951 A | | 10/2006 | |
| KR | 10-2007-0048866 A | | 5/2007 | |
| KR | 10-1116644 A | | 2/2012 | |
| KR | 10-1329304 A | | 11/2013 | |
| KR | 10-1395251 A | | 5/2014 | |
| KR | 20140144806 A | * | 12/2014 | |
| KR | 10-2017-0137245 A | | 12/2017 | |
| KR | 10-1874901 A | | 6/2018 | |
| KR | 10-1935951 A | | 12/2018 | |
| KR | 10-2019-0003068 A | | 1/2019 | |
| KR | 20220072910 A | * | 6/2022 | |

OTHER PUBLICATIONS

Request for the Submission of an Opinion issued by the Korean Intellectual Property Office on Nov. 16, 2022 in corresponding KR Patent Application No. 10-2020-0159562, with English Translation.

* cited by examiner

APPARATUS FOR TREATING SUBSTRATE AND METHOD OF COUPLING SUPPORT UNIT

CROSS-REFERENCE TO RELATED APPLICATIONS

This application claims priority to and the benefit of Korean Patent Application No. 10-2020-0159562 filed in the Korean Intellectual Property Office on Nov. 25, 2020, the entire contents of which are incorporated herein by reference.

TECHNICAL FIELD

The present invention relates to a substrate treating apparatus including a support unit supporting a substrate within a process chamber, and a method of coupling the support unit to the process chamber.

BACKGROUND ART

In general, a semiconductor device is manufactured from a substrate, such as a wafer. In particular, the semiconductor device is manufactured by forming a fine circuit pattern on an upper surface of a substrate by performing a deposition process, a photolithography process, a cleaning process, a drying process, an etching process, and the like.

In general, the cleaning process includes chemical processing of removing foreign substances on a substrate by supplying a chemical to the substrate, rinsing processing of removing the chemicals left on the substrate by supplying deionized water to the substrate, and drying processing of removing the deionized water left on the substrate.

A supercritical fluid is used for the drying processing of the substrate. According to one example, after the deionized water on the substrate is substituted with an organic solvent, the organic solvent left on the substrate is dissolved in the supercritical fluid by supplying the supercritical fluid to the upper surface of the substrate within the chamber to remove the organic solvent from the substrate. When isopropyl alcohol (hereinafter, referred to as "IPA") is used as the organic solvent, carbon dioxide ($CO_2$) which has a relatively low critical temperature and critical pressure and in which IPA is well soluble is used as the supercritical fluid.

The processing of the substrate by using the supercritical fluid is as follow. When the substrate is loaded into the chamber, carbon dioxide in the supercritical state is supplied into the chamber to pressurize the inside of the chamber, and then, the substrate is treated with the supercritical fluid while repeating supply of the supercritical fluid and exhaust within the chamber. Then, when the processing of the substrate is completed, the inside of the chamber is exhausted and decompressed. After the chamber is exhausted, a process of removing the substrate by opening the chamber and repairing the chamber is performed.

In general, a support unit provided for supporting the substrate within the chamber is coupled to a process chamber by a bolt and the like. However, the component, such as the bolt, generates particles within the treatment space.

Further, it is difficult to replace the component of the support unit, and it is difficult to adjust a height and horizontality of the support unit provided for supporting the substrate within the chamber.

SUMMARY OF THE INVENTION

The present invention has been made in an effort to provide a substrate treating apparatus including a support unit which minimally generates particles within a treatment space, and a method of coupling a support unit.

The present invention has also been made in an effort to provide a substrate treating apparatus including a support unit in which it is easy to replace a component, and a method of coupling a support unit.

The present invention has also been made in an effort to provide a substrate treating apparatus including a support unit, of which horizontality is easy to be adjusted, and a method of coupling a support unit.

The problem to be solved by the present invention is not limited to the above-mentioned problems, and the problems not mentioned will be clearly understood by those skilled in the art from the present specification and the accompanying drawings.

An exemplary embodiment of the present invention provides an apparatus for treating a substrate, including: a process chamber including a first body and a second body which are combined with each other to form a treatment space for treating a substrate is treated therein; a driver which moves the process chamber to an open position or a close position; a support unit which supports a substrate within the treatment space; and a fluid supply unit which supplies a fluid to the treatment space, in which the support unit includes: a support pin coupled to the first body or the second body; and a guide member which is coupled to the support pin and extends in a lateral direction of the support pin to support the substrate.

In the exemplary embodiment, the support pin may be coupled to the first body or the second body by welding.

In the exemplary embodiment, the guide member may be fitted to the support pin

In the exemplary embodiment, the guide member may include a contact portion which is in contact with a bottom surface of the substrate placed on the support unit and is shaped like a protrusion, and the contact portion may be made of a material that is possible to be polished.

In the exemplary embodiment, the contact portion may be provided in plurality, and each of the contact portions is polished so that the substrate placed on the support unit becomes horizontal.

In the exemplary embodiment, the contact portion may be made of any one of a resin based on polyimide (PI), polyetheretherketone (PEEK), and polytetrafluoroethylene (PTFE), and ceramic.

In the exemplary embodiment, the guide member may be fixed to the support pin by a ring member which is coupled to the support pin and prevents the guide member from being separation.

In the exemplary embodiment, the support pin may be coupled to the first body, and the first body may be provided on an upper portion of the second body.

In the exemplary embodiment, the treating of the substrate may be the treating of drying the substrate by using a supercritical fluid inside the treatment space.

Another exemplary embodiment of the present invention provides an apparatus for treating a substrate, the apparatus including: a support unit which is provided in a process chamber and supports a substrate; a support pin coupled to the process chamber; and a guide member which is coupled to the support pin and extends in a lateral direction of the support pin to support the substrate.

In the exemplary embodiment, the support pin may be coupled to the process chamber by welding.

In the exemplary embodiment, the guide member may be fitted to the support pin.

In the exemplary embodiment, the guide member may include a contact portion which is in contact with a bottom surface of the substrate placed on the support unit and is shaped like a protrusion, and the contact portion is made of a material that is possible to be polished.

In the exemplary embodiment, the contact portion may be provided in plurality, and each of the contact portions may be polished so that the substrate placed on the support unit becomes horizontal.

In the exemplary embodiment, the contact portion may be made of any one of a resin based on polyimide (PI), polyetheretherketone (PEEK), and polytetrafluoroethylene (PTFE), and ceramic.

In the exemplary embodiment, the guide member may be fixed to the support pin by a ring member which is coupled to the support pin and prevents the guide member from being separation.

Still another exemplary embodiment of the present invention provides a method of coupling a support unit to a process chamber, and a first body is provided on an upper portion of a second body, and a support pin is coupled to the first body by welding.

In the exemplary embodiment, the guide member may be fitted to the support pin that is coupled to the first body by welding.

In the exemplary embodiment, after the guide member may be coupled to the support pin, a ring member that prevents the guide member from being separated is coupled to the support pin.

In the exemplary embodiment, the guide member may include a contact portion which is in contact with a bottom surface of the substrate placed on the support unit and is shaped like a protrusion, and the contact portion may be made of a material that is possible to be polished, and the contact portion may be provided in plurality, and each of the contact portions may be polished so that the substrate placed on the support unit becomes horizontal.

According to the exemplary embodiments of the present invention, there is an advantage in that it is possible to minimize the generation of particles within the treatment space.

Further, according to the exemplary embodiments of the present invention, there is an advantage in that it is easy to replace a component of the support unit.

Further, the present invention has an advantage in that it is easy to make the support unit be horizontal.

The effect of the present invention is not limited to the foregoing effects, and those skilled in the art may clearly understand non-mentioned effects from the present specification and the accompanying drawings.

DETAILED DESCRIPTION

Figure 1:
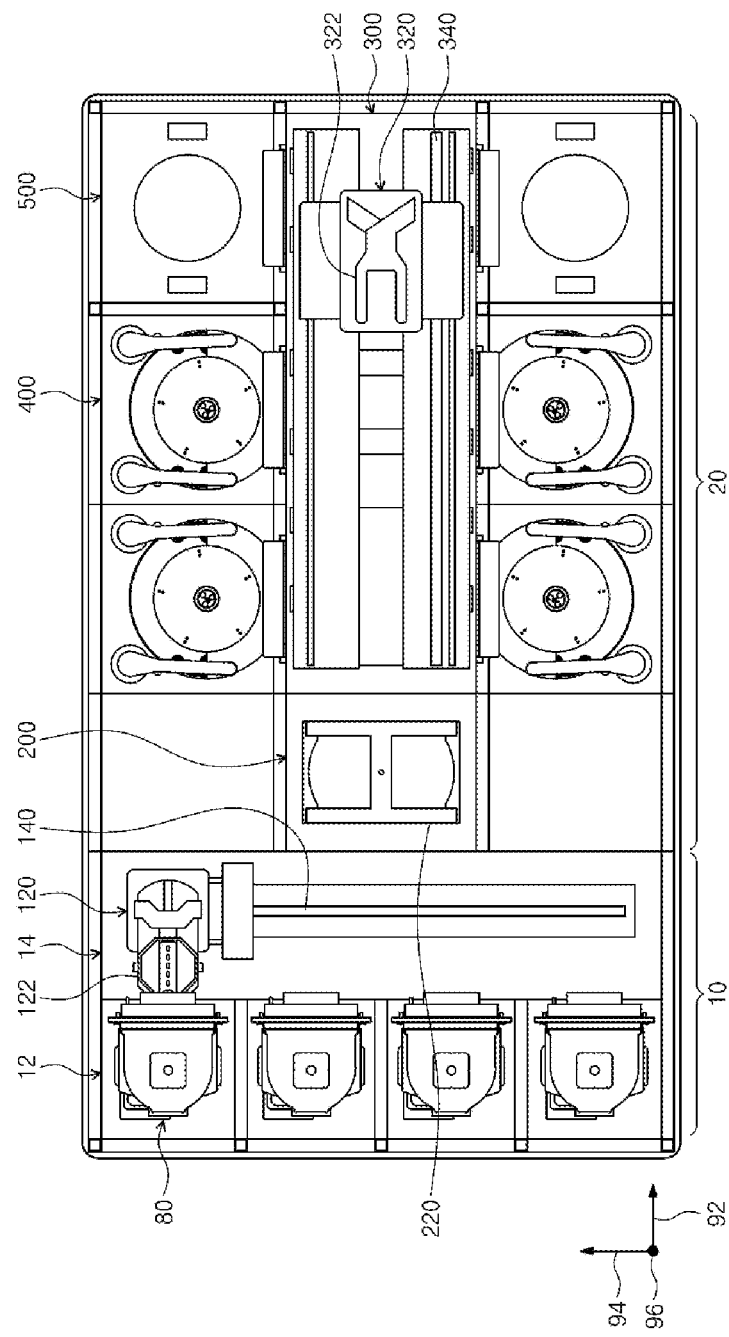
FIG. 1 is a top plan view schematically illustrating a substrate treating apparatus according to an exemplary embodiment of the present invention.

Hereinafter, the exemplary embodiment of the present invention will be described in more detail with reference to the accompanying drawings. The exemplary embodiment of the present invention may be modified in various forms, and the scope of the present invention should not be construed as being limited to the following exemplary embodiments. The present exemplary embodiment is provided to more completely explain the present invention to those skilled in the art. Therefore, the shape of the element in the drawings is exaggerated to emphasize a clearer description.

FIG. 1 is a top plan view schematically illustrating a substrate treating apparatus according to an exemplary embodiment of the present invention. Referring to FIG. 1, the substrate treating apparatus includes an index module 10, a treating module 20, and a controller (not illustrated). According to the exemplary embodiment, the index module 10 and the treating module 20 are disposed in one direction. Hereinafter, the direction in which the index module 10 and the treating module 20 are disposed is referred to as a first direction 92, and when viewed from above, a direction vertical to the first direction 92 is referred to as a second direction 94, and a direction vertical to both the first direction 92 and the second direction 94 is referred to as a third direction 96.

The index module 10 transports a substrate W from a vessel 80 in which the substrate W is accommodated to the treating module 20, and makes the substrate W, which has been completely treated in the treating module 20, be accommodated in the vessel 80. A longitudinal direction of the index module 10 is the second direction 94. The index module 10 includes a load port 12 and an index frame 14. Based on the index frame 14, the load port 12 is located at a side opposite to the treating module 20. The vessel 80 in which the substrates W are accommodated is placed on the load port 12. The load port 12 may be provided in plurality, and the plurality of load ports 12 may be disposed in the second direction 94.

As the vessel 80, an airtight vessel, such as a Front Open Unified Pod (FOUP), may be used. The vessel 80 may be placed on the load port 12 by a transport means (not illustrated), such as an overhead transfer, an overhead conveyor, or an automatic guided vehicle, or an operator.

An index robot 120 is provided to the index frame 14. A guide rail 140 of which a longitudinal is the second direction 94 is provided within the index frame 14, and the index robot 120 may be provided to be movable on the guide rail 140. The index robot 120 includes a hand 122 on which the substrate W is placed, and the hand 122 may be provided to be movable forward and backward, rotatable based on the third direction 96 as an axis, and movable in the third direction 96. The plurality of hands 122 is provided while being spaced apart from each other in the vertical direction, and is capable of independently moving forward and backward.

The treating module 20 includes a buffer unit 200, a transport device 300, a liquid treating device 400, and a supercritical device 500. The buffer unit 200 provides a space in which the substrate W loaded to the treating module 20 and the substrate W unloaded from the treating module 20 stay temporarily. The liquid treating device 400 performs a liquid treating process of supplying a liquid onto the substrate W and treating the substrate W with the liquid. The supercritical device 500 performs a drying process of removing the liquid left on the substrate W. The transport device 300 transports the substrate W between the buffer unit 200, the liquid treating device 400, and the supercritical device 500.

A longitudinal direction of the transport device 300 may be the first direction 92. The buffer unit 200 may be disposed between the index module 10 and the transport device 300. The liquid treating device 400 and the supercritical device 500 may be disposed on a lateral portion of the transport device 300. The liquid treating device 400 and the transport device 300 may be disposed in the second direction 94. The supercritical device 500 and the transport device 300 may be disposed in the second direction 94. The buffer unit 200 may be positioned at one end of the transport device 300.

According to one example, the liquid treating devices 400 may be disposed at both sides of the transport device 300, the supercritical devices 500 may be disposed at both sides of the transport device 300, and the liquid treating devices 400 may be disposed at positions closer to the buffer unit 200 than the supercritical devices 500. At one side of the transport device 300, the liquid treating devices 400 may be provided in an arrangement of A×B (each of A and B is 1 or a natural larger than 1) in the first direction 92 and the third direction 96. At one side of the transport device 300, the supercritical devices 500 may be provided in number of C×D (each of C and D is 1 or a natural larger than 1) in the first direction 92 and the third direction 96. Unlike the description, only the liquid treating devices 400 may be provided at one side of the transport device 300, and only the supercritical devices 500 may be provided at the other side of the transport device 300.

The transport device 300 includes a transport robot 320. A guide rail 340, of which a longitudinal direction is the first direction 92, is provided within the transport device 300, and the transport robot 320 may be provided to be movable on the guide rail 340. The transport robot 320 includes a hand 322 on which the substrate W is placed, and the hand 322 may be provided to be movable forward and backward, rotatable based on the third direction 96 as an axis, and movable in the third direction 96. The plurality of hands 322 is provided while being spaced apart from each other in the vertical direction, and is capable of independently moving forward and backward.

The buffer unit 200 includes a plurality of buffers 220 on which the substrate W is placed. The buffers 220 may be disposed while being spaced apart from each other in the third direction 96. A front face and a rear face of the buffer unit 200 are opened. The front face is the face facing the index module 10, and the rear face is the face facing the transport device 300. The index robot 120 may approach the buffer unit 200 through the front face, and the transport robot 320 may approach the buffer unit 200 through the rear face.

Figure 2:
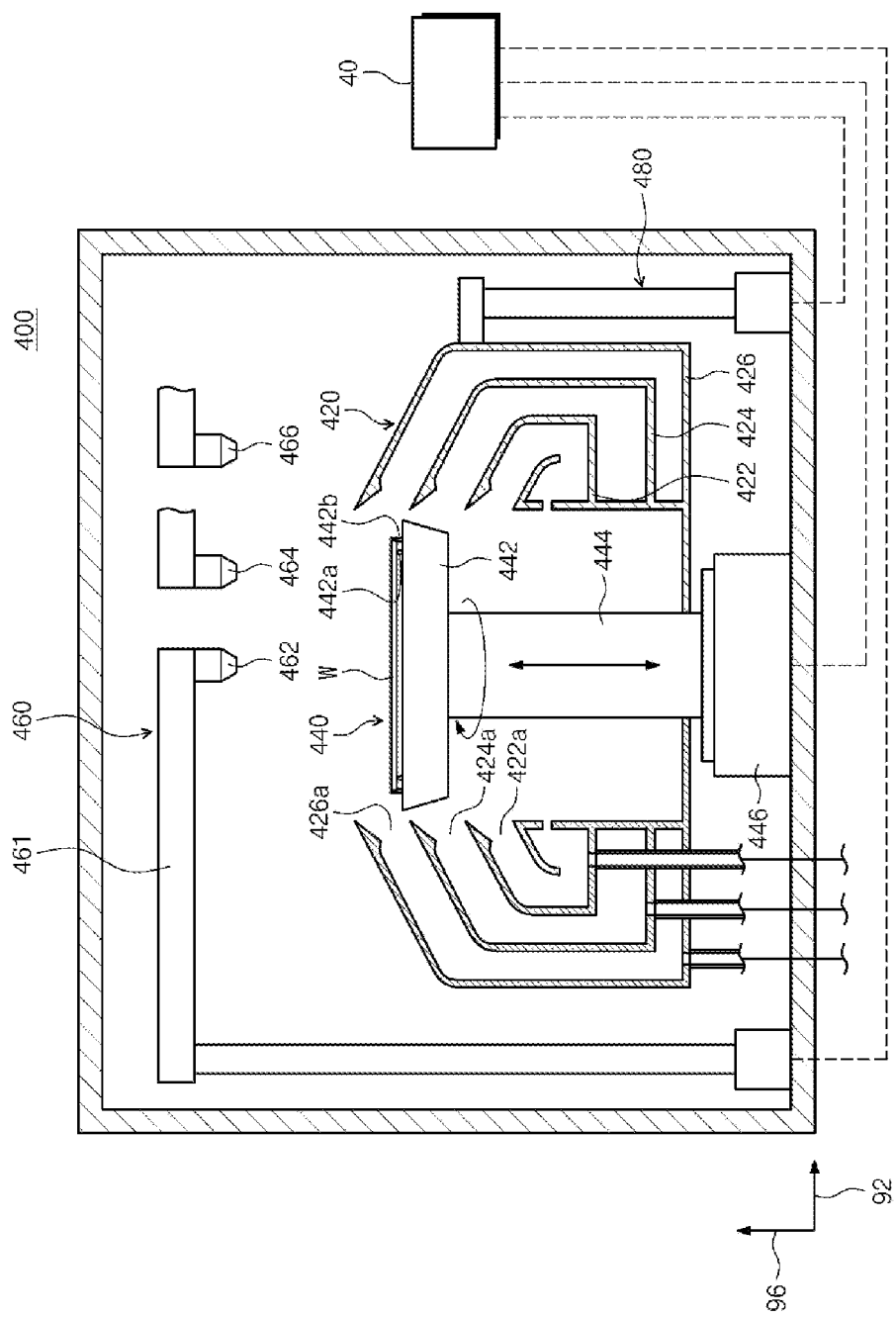
FIG. 2 is a diagram schematically illustrating a liquid treating device of FIG. 1 according to the exemplary embodiment of the present invention.

FIG. 2 is a diagram schematically illustrating the liquid treating device 400 of FIG. 1 according to the exemplary embodiment of the present invention. Referring to FIG. 2, the liquid treating device 400 includes a housing 410, a cup 420, a support unit 440, a liquid supplying unit 460, a lifting unit 480, and a control unit 40. The control unit 40 controls the operations of the liquid supplying unit 460, the support unit 440, and the lifting unit 480. The housing 410 is provided in a generally rectangular parallelepiped shape. The cup 420, the support unit 440, and the liquid supplying unit 460 are disposed within the housing 410.

The cup 420 has a treatment space having an open top, and the substrate W is liquid-treated within the treatment space. The support unit 440 supports the substrate W within the treatment space. The liquid supplying unit 460 supplies the liquid onto the substrate W supported by the support unit 440. The liquid may be provided in a plurality of types, and may be sequentially supplied onto the substrate W. The lifting unit 480 adjusts a relative height between the cup 420 and the support unit 440.

According to one example, the cup 420 includes a plurality of recovery containers 422, 424, and 426. Each of the recovery containers 422, 424, and 426 has a recovery space of recovering the liquid used for the treatment of the substrate. Each of the recovery containers 422, 424, and 426 is provided in a ring shape surrounding the support unit 440. The pre-treatment liquid scattered by the rotation of the substrate W when the liquid treatment process progresses is introduced into the recovery space through inlets 422a, 424a, and 426a of the recovery containers 422, 424, and 426, respectively. According to one example, the cup 420 includes the first recovery container 422, the second recovery container 424, and the third recovery container 426. The first recovery container 422 is disposed to surround the support unit 440, the second recovery container 424 is disposed to surround the first recovery container 422, and the third recovery container 426 is disposed to surround the second recovery container 424. The second inlet 424a through which the liquid is introduced to the second recovery container 424 may be positioned above the first inlet 422a through which the liquid is introduced to the first recovery container 422, and the third inlet 426a through which the liquid is introduced to the third recovery container 426 may be positioned above the second inlet 424a.

The support unit 440 includes a support plate 442 and a driving shaft 444. An upper surface of the support plate 442 may be provided in a generally circular shape, and may have a diameter larger than a diameter of the substrate W. A support pin 442a supporting the rear surface of the substrate W is provided to a center portion of the support plate 442, and an upper end of the support pin 442a is provided to protrude from the support plate 442 so that the substrate W is spaced apart from the support plate 442 by a predetermined distance. A chuck pin 442b is provided to an edge of the support plate 442.

The chuck pin 442b is provided to protrude upward from the support plate 442, and supports the lateral portion of the substrate W so that the substrate W is not separated from the support unit 440 when the substrate W is rotated. The driving shaft 444 is driven by the driving member 446, and is connected with a center of the bottom surface of the substrate W, and rotates the support plate 442 based on a center axis of the support plate 442.

According to one example, the liquid supplying unit 460 includes a first nozzle 462, a second nozzle 464, and a third nozzle 446. The first nozzle 462 supplies a first liquid onto the substrate W. The first liquid may be the liquid of removing a film or foreign substances left on the substrate W. The second nozzle 464 supplies a second liquid onto the substrate W. The second liquid may be the liquid well soluble in a third liquid. For example, the second liquid may be the liquid that is better soluble in the third liquid than the first liquid. The second liquid may be the liquid that neutralizes the first liquid supplied onto the substrate W. Further, the second liquid may be the liquid that neutralizes the first solution and at the same time is better soluble in the third solution than the first solution.

According to one example, the second liquid may be water. The third nozzle 466 supplies the third liquid onto the substrate W. The third liquid may be the liquid well soluble in a supercritical fluid used in the supercritical device 500. For example, the third liquid may be the liquid that is better soluble in the supercritical fluid used in the supercritical device 500 than the second liquid. According to an example, the third liquid may be an organic solvent. The organic solvent may be isopropyl alcohol (IPA). For example, the supercritical fluid may be carbon dioxide.

The first nozzle 462, the second nozzle 464, and the third nozzle 466 may be supported by different arms 461, and the arms 461 may be independently moved. Optionally, the first nozzle 462, the second nozzle 464, and the third nozzle 466 may be mounted to the same arm and moved at the same time.

The lifting unit 480 moves the cup 420 in the vertical direction. By the vertical movement of the cup 420, a relative height between the cup 420 and the substrate W is changed. Through this, the recovery containers 422, 424, and 426 to which a pre-treatment liquids are recovered are changed according to the type of liquid supplied to the substrate W, so that it is possible to separate and recover the liquids. Unlike the description, the cup 420 may be fixedly installed, and the lifting unit 480 may move the support unit 440 in the vertical direction.

Figure 3:
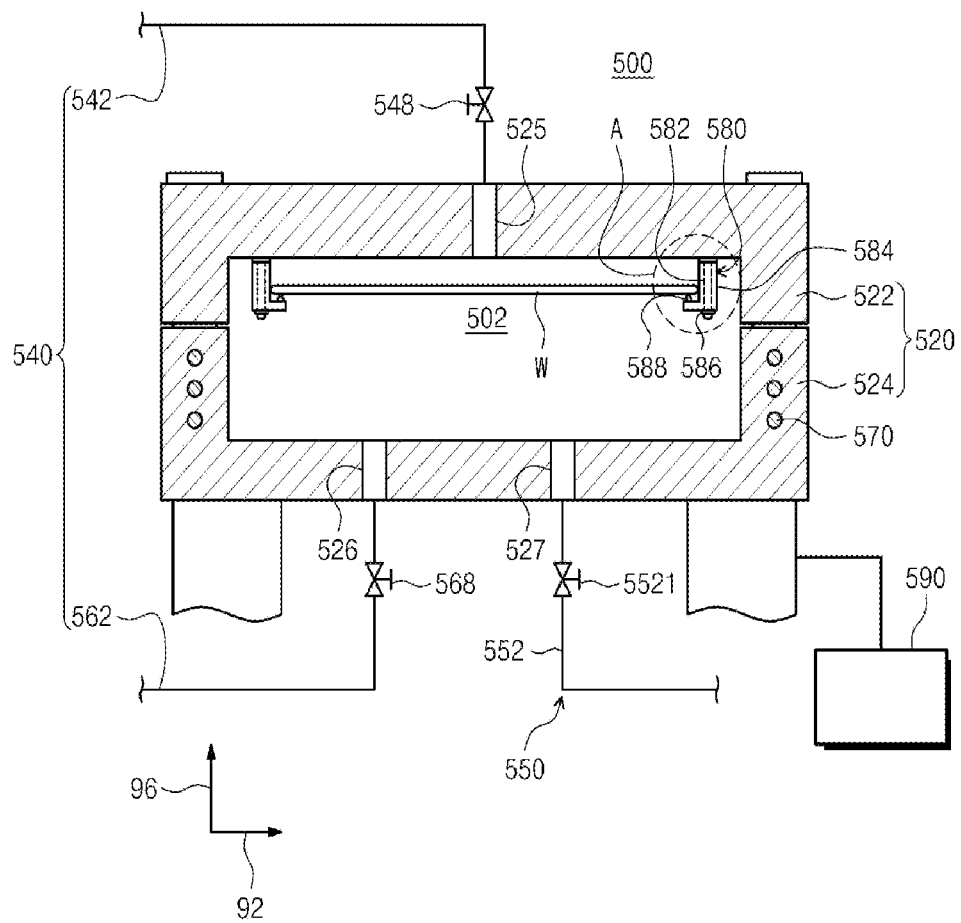
FIG. 3 is a diagram schematically illustrating a supercritical device of FIG. 1 according to the exemplary embodiment of the present invention.
Figure 4:
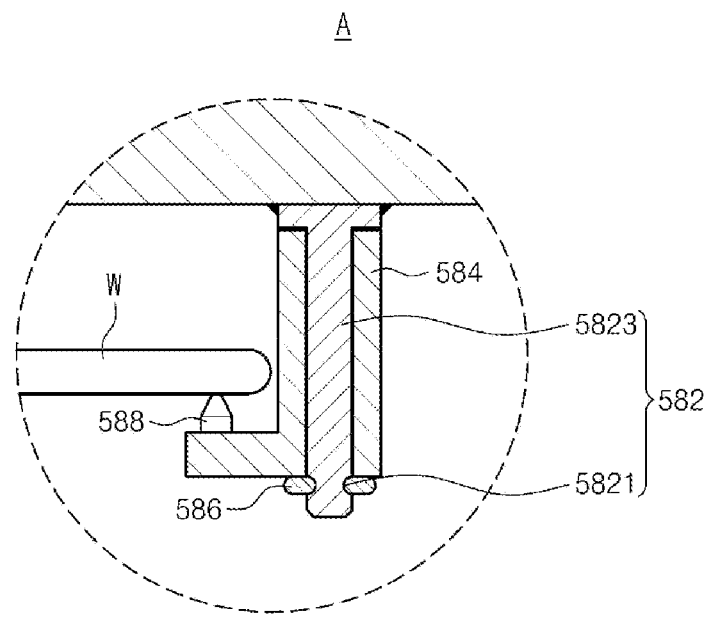
FIG. 4 is an enlarged view of portion A of FIG. 3.

Each of FIGS. 3 and 4 is a diagram schematically illustrating the supercritical device 500 of FIG. 1 according to the exemplary embodiment. According to the exemplary embodiment, the supercritical device 500 removes the liquid on the substrate W by using the supercritical fluid. According to the exemplary embodiment, the liquid on the substrate W may be IPA. The supercritical device 500 removes the IPA from the substrate W by supplying the supercritical fluid onto the substrate and dissolving the IPA on the substrate W in the supercritical fluid.

The supercritical device 500 includes a process chamber 520, a fluid supply line 540, a support unit 580, a driving member 590, and an exhaust unit 550.

The process chamber 520 provides a processing space 502 in which a supercritical process is performed. In one example, the process chamber 520 may be provided in a circular shape. Otherwise, unlike this, the process chamber 520 may be provided in a cuboid shape. The process chamber 520 includes a first body 522 and a second body 524. The first body 522 and the second body 524 are combined with each other to provide the processing space 502. In one example, the first body 522 is provided in a circular shape when viewed from above. Similarly, the second body 524 is provided in a circular shape when viewed from above. In one example, the first body 522 is provided on an upper portion of the second body 524. Optionally, the first body 522 and the second body 524 may be provided at the same height, and the first body 522 and the second body 524 may be opened/closed left and right.

When the first body 522 is spaced apart from the second body 524, the processing space 502 is opened, and in this case, the substrate W is loaded in or loaded out. The driving member 590 moves up or down any one of the first body 522 and the second body 524 so that the process chamber 520 moves to an open position or a close position. In one example, the driving member 590 may be provided with a cylinder. Herein, the open position is the position at which the first body 522 is spaced apart from the second body 524, and the close position is the position where the contact surfaces of the first body 522 and the second body 524 facing each other are in close contact with each other. That is, at the open position, the processing space 502 is opened from the outside, and at the close position, the processing space 502 is closed. In one example, the driving member 590 moves up or down any one of the first body 522 and the second body 524.

In one example, a first discharge hole 525 connected with the first supply line 542 may be formed in the first body 522. A fluid may be supplied to the processing space 502 through the first discharge hole 525. In one example, a second discharge hole 524 connected with the second supply line 562 and an exhaust hole 527 connected with the exhaust line 552 may be formed in the second body 524. Optionally, only one of the first discharge hole 525 and the second discharge hole 526 may be provided to the process chamber 520. In one example, a heater 570 is provided to an inner portion of a wall of the process chamber 520. The heater 570 heats the processing space 502 of the process chamber 520 so that the fluid supplied into the internal space of the process chamber 520 is maintained in a supercritical state. An atmosphere by the supercritical fluid is formed inside the processing space 502.

The support unit 580 supports the substrate W within the processing space 502 of the process chamber 520. The substrate W loaded into the processing space 502 of the process chamber 520 is placed on the support unit 580. According to one example, the substrate W is supported by the support unit 580 so that a pattern surface heads upward. In one example, the support unit 580 supports the substrate W above the second discharge hole 526. In one example, the support unit 580 may be coupled to the first body 522. Optionally, the support unit 580 may be coupled to the second body 524.

Further, the exhaust unit 550 is coupled to the second body 524. The supercritical fluid within the processing space 502 of the process chamber 520 is exhausted to the outside of the process chamber 520 through the exhaust unit 550. The exhaust unit 550 includes an exhaust line 552 and an exhaust valve 5521. The exhaust valve 5521 is installed in the exhaust line 552 to adjust whether the processing space 502 is exhausted and an exhaust rate.

In the process progress, the first body 522 and the second body 524 are in close contact with each other so that the processing space 502 is sealed from the outside. In one example, the first body 522 and the second body 524 are made of a metal material. For example, first body 522 and the second body 524 are made of stainless.

Figure 5:
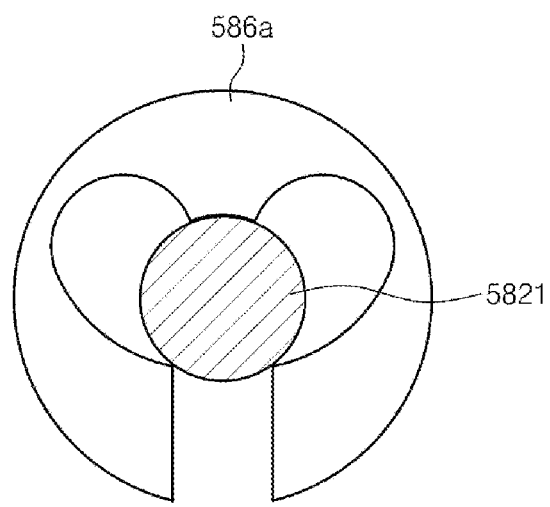
FIGS. 5 and 6 are diagrams illustrating the state where a ring member is coupled to a support pin according to the exemplary embodiment of the present invention.
Figure 6:
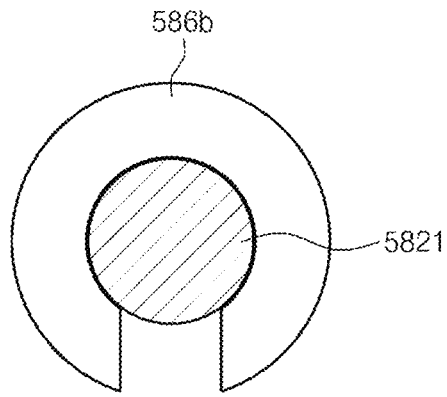

Hereinafter, the support unit 580 of the present invention will be described in detail with reference to FIGS. 4 to 6. FIG. 4 is an enlarged view of portion A of FIG. 3. Referring to FIG. 4, the support unit 580 includes a support pin 582, a guide member 584, and a ring member 586.

The support pin 582 is coupled to the process chamber 520. In one example, the support pin 582 is coupled to the first body 522. Optionally, the support pin 582 may be coupled to the second body 524. In one example, the first body 522 is placed on an upper portion of the second body 524, and the support pin 582 is coupled to the first body 522 by welding. Accordingly, in order to couple the support pin 582 to the process chamber 520, a separate structure, such as a bolt, is not required. The support pin 582 has a body portion 5823 and a recess portion 5821. In one example, the guide member 584 is coupled to the body portion 5823 and the ring member 586 is coupled to the recess portion 5821.

The guide member 584 supports the substrate W. The guide member 584 is coupled to the support pin 582, and is extended in a lateral direction of the support pin 582. In one example, the guide member 584 is fitted to the support in 582. For example, a diameter of a hollow formed in the guide member 584 may be the same as or slightly larger than a diameter of the support pin 582.

The guide member 584 is fixed to the support pin 582 by the ring member 586 which is coupled to the support pin 582 to prevent the separation of the guide member 584. FIGS. 5 and 6 are diagrams illustrating the state where the ring member 586 is coupled to the support pin 582 according to the exemplary embodiment of the present invention. Referring to FIG. 5, the ring member 586 may be provided with an E-ring. Optionally, the ring member 586 may be provided with a C-ring as illustrated in FIG. 6. In one example, the ring member 586 is coupled to the recess portion 5821 of the support pin 582. Accordingly, the ring member 586 prevents the guide member 584 from flowing from the support pin 582.

In one example, the guide member 584 includes a contact portion 588 shaped like a protrusion that is in contact with the bottom surface of the substrate W placed on the support unit 580. The contact portion 588 is made of a material that can be polished. In one example, the contact portion 588 may be made of any one of a resin based on polyimide (PI), polyetheretherketone (PEEK), and polytetrafluoroethylene (PTFE), and ceramic. In one example, the contact portion 588 is integrally manufactured with the guide member 584. Optionally, the contact portion 588 is manufactured as a separate member so as to be separated from the guide member 584 and is coupled to the guide member 584.

In one example, the contact portion 588 is provided in plurality, and each contact portion 588 is polished so that the substrate W placed on the support unit 580 becomes horizontal. In one example, the contact portion 588 is polished so that the substrate W placed on the support unit 580 is placed at a desired height. In one example, two contact portions 588 are provided to the guide member 584 per one side so that a total of four contact portions 588 may be provided. Even though all of the contact portions 588 are provided to have the same height and shape, the substrate W may not be placed flat due to an assembly matter of each configuration on the support unit 580 and the like. Accordingly, the horizontality of the substrate W and the height at which the substrate W is placed are adjusted by individually polishing the contact portion 588.

Figure 7:
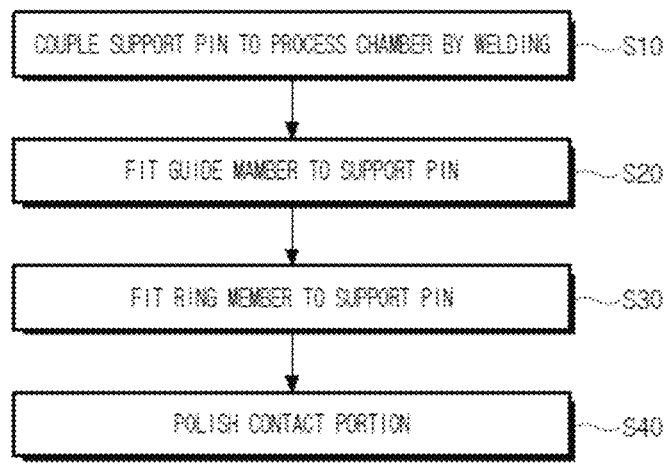
FIG. 7 is a flowchart illustrating a method of coupling a support unit according to an exemplary embodiment of the present invention.
Figure 8:
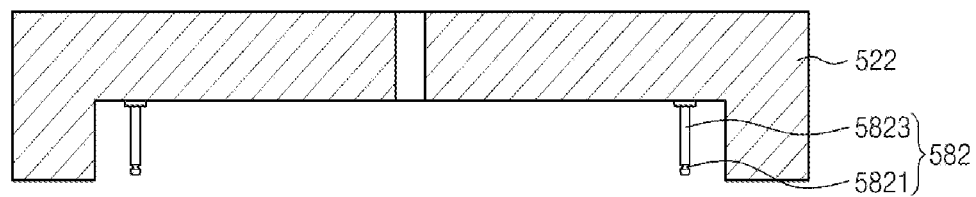
FIGS. 8 to 10 are diagrams sequentially illustrating the method of coupling the support unit according to the exemplary embodiment of the present invention.
Figure 9:
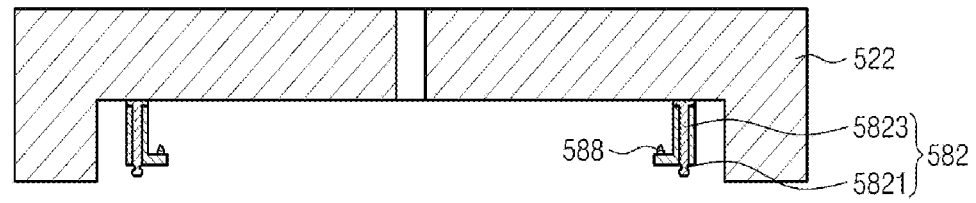
Figure 10:
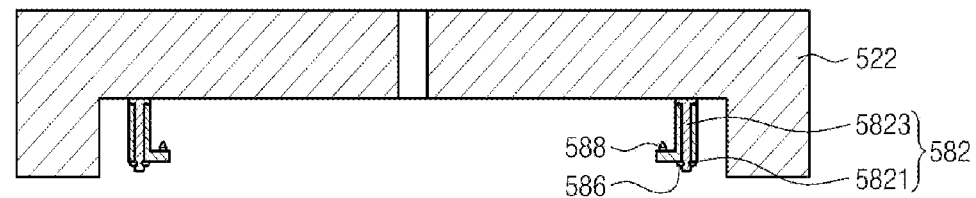

Hereinafter, a method of coupling the support unit 580 of the present invention will be described with reference to FIGS. 7 to 10. FIG. 7 is a flowchart illustrating a method of coupling the support unit 580 according to the exemplary embodiment of the present invention. As illustrated in FIG. 8, first, the support pin 582 is coupled to the first body 522 by welding. Then, as illustrated in FIG. 9, the guide member 584 is fitted to the welding-coupled support pin 582. Then, after the guide member 584 is coupled to the support pin 582 as illustrated in FIG. 10, the ring member 586 preventing the guide member 584 from being separated is coupled to the support pin 582. In this case, the horizontality and the height of the substrate W are checked, and the operator polishes the contact portion 588. In order to polish the contact portion 588, the method may include a process of separating the guide member 584 or the contact portion 588 from the support pin 582 again. In one example, the driving member 590 opens/closes the process chamber 520 by moving up and down the second body 524. Accordingly, the first body 522 is fixed in place, and there is no large movement in the support unit 580, so that there is an advantage in that the horizontality and the height of the substrate W may be maintained by polishing the contact portion 588 before the start of the process.

Figure 11:
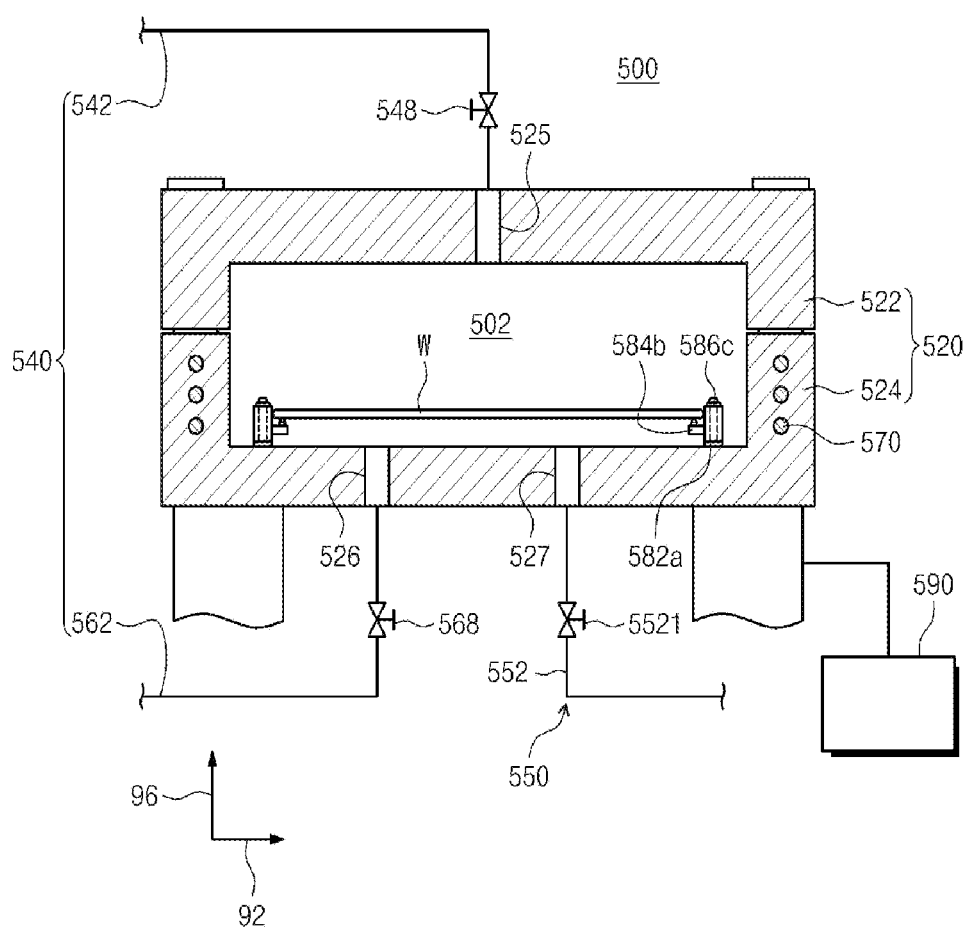
FIG. 11 is a diagram schematically illustrating a supercritical device according to another exemplary embodiment of the present invention.

In the foregoing example, the coupling of the support unit 580 to the first body 522 has been described. However, contrary to this, the support unit 580 may be coupled to the second body 524 as illustrated in FIG. 11.

According to the exemplary embodiment of the present invention, the support pin 582 is coupled to the process chamber 520 by welding, so that there is an advantage in that the generation of particles in the structure for coupling the support pin 582 and the process chamber 520 is minimized.

According to the exemplary embodiment of the present invention, since the support pin 582 and the guide member 584 are fitted together, a structure, such as a screw thread, is not required, so that there is an advantage in that the generation of particles is minimized.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate, the apparatus comprising:
    a process chamber including a first body and a second body which are combined with each other to form a treatment space therein for treating a substrate;
    a driver configured to move the process chamber to an open position or a close position;
    a support unit configured to support a substrate within the treatment space; and
    a fluid supply unit configured to supply a fluid to the treatment space,
    wherein the support unit includes:
    a support pin coupled to the first body or the second body, the support pin including a body portion and a recess portion; and
    a guide member coupled to the support pin and extending in a lateral direction of the support pin to support the substrate,
    wherein the guide member is fixed to the body portion of the support pin by a ring member which is coupled to the recess portion of the support pin and prevents the guide member from being separated.

2. The apparatus of claim 1, wherein the support pin is coupled to the first body or the second body by welding.

3. The apparatus of claim 1, wherein the guide member is fitted to the support pin.

4. The apparatus of claim 1, wherein the guide member includes a contact portion which is in contact with a bottom surface of the substrate placed on the support unit and is shaped like a protrusion, and the contact portion is made of a material that is possible to be polished.

5. The apparatus of claim 4, wherein the contact portion is provided in plurality, and each of the contact portions is polished so that the substrate placed on the support unit becomes horizontal.

6. The apparatus of claim 4, wherein the contact portion is made of any one of a resin based on polyimide (PI), polyetheretherketone (PEEK), and polytetrafluoroethylene (PTFE), and ceramic.

7. The apparatus of claim 1, wherein the support pin is coupled to the first body, and the first body is provided on an upper portion of the second body.

8. The apparatus of claim 1, wherein treating the substrate includes drying the substrate by using a supercritical fluid inside the treatment space.

9. An apparatus for treating a substrate, the apparatus comprising:
   a support unit which is provided in a process chamber and supports a substrate;
   a support pin coupled to the process chamber, the support pin including a body portion and a recess portion; and
   a guide member coupled to the support pin and extending in a lateral direction of the support pin to support the substrate,
   wherein the guide member is fixed to the body portion of the support pin by a ring member which is coupled to the recess portion of the support pin and prevents the guide member from being separated.

10. The apparatus of claim 9, wherein the support pin is coupled to the process chamber by welding.

11. The apparatus of claim 9, wherein the guide member is fitted to the support pin.

12. The apparatus of claim 9, wherein the guide member includes a contact portion which is in contact with a bottom surface of the substrate placed on the support unit and is shaped like a protrusion, and
   the contact portion is made of a material that is possible to be polished.

13. The apparatus of claim 12, wherein the contact portion is provided in plurality, and each of the contact portions is polished so that the substrate placed on the support unit becomes horizontal.

14. The apparatus of claim 12, wherein the contact portion is made of any one of a resin based on polyimide (PI), polyetheretherketone (PEEK), and polytetrafluoroethylene (PTFE), and ceramic.

* * * * *